US009720325B2

(12) United States Patent
Hsu et al.

(10) Patent No.: US 9,720,325 B2
(45) Date of Patent: Aug. 1, 2017

(54) PHOTORESIST COATING SCHEME

(71) Applicant: Taiwan Semiconductor Manufacturing Company, Ltd., Hsin-Chu (TW)

(72) Inventors: Chih-Hsien Hsu, Hsin-Chu (TW); Hong-Hsing Chou, Jhubei (TW); Hu-Wei Lin, Hsinchu (TW); Chi-Jen Hsieh, Toufen Township (TW); Jr-Wei Ye, Erlin Township (TW); Yuan-Ting Huang, Hsinchu (TW); Ching-Hsing Chiang, Hsin-Chu (TW); Hua-Kuang Teng, Qionglin Township (TW); Yen-Chen Lin, Hsinchu (TW); Carolina Poe, Jhubei (TW); Tsung-Cheng Huang, Jhubei (TW); Chia-Hung Chu, Pingzhen (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 93 days.

(21) Appl. No.: 14/029,226

(22) Filed: Sep. 17, 2013

(65) Prior Publication Data
US 2015/0079806 A1 Mar. 19, 2015

(51) Int. Cl.
*B05D 3/12* (2006.01)
*G03F 7/16* (2006.01)
*H01L 21/67* (2006.01)
*B05D 1/00* (2006.01)

(52) U.S. Cl.
CPC .......... *G03F 7/162* (2013.01); *H01L 21/6715* (2013.01); *B05D 1/005* (2013.01)

(58) Field of Classification Search
CPC ...... B05D 1/005; H01L 21/6715; G03F 7/162
USPC ........... 427/240, 425; 118/52, 320; 438/780, 438/782
See application file for complete search history.

(56) References Cited

U.S. PATENT DOCUMENTS

| 5,773,083 | A * | 6/1998 | Fischer et al. ................. 427/240 |
| 5,989,632 | A * | 11/1999 | Sanada et al. ................. 427/240 |
| 8,043,657 | B2 * | 10/2011 | Yoshihara et al. ............ 427/240 |
| 2005/0175771 | A1 * | 8/2005 | Hisada ........................... 427/162 |
| 2009/0226615 | A1 * | 9/2009 | Nakazawa ..................... 427/256 |
| 2012/0238106 | A1 * | 9/2012 | Chuang ......................... 438/758 |

* cited by examiner

Primary Examiner — Kirsten Jolley
(74) Attorney, Agent, or Firm — Slater Matsil, LLP

(57) ABSTRACT

A method includes rotating a wafer at a first speed for a first time duration. The wafer is rotated at a second speed that is lower than the first speed for a second time duration after the first time duration. The wafer is rotated at a third speed that is higher than the second speed for a third time duration after the second time duration. A photoresist is dispensed on the wafer during the first time duration and at least a portion of a time interval that includes the second time duration and the third time duration.

21 Claims, 3 Drawing Sheets

PHOTORESIST COATING SCHEME

TECHNICAL FIELD

The present disclosure relates generally to an integrated circuit and more particularly a photoresist coating scheme.

BACKGROUND

In some photoresist coating methods, the photoresist usage rate is less than 5% and 95% is wasted. After the photoresist is dispensed on a wafer, a high spin speed is needed for the photoresist to extend to the whole wafer. The high speed not only makes the wafer edge tangent speed higher, but also makes more photoresist spin off the wafer.

BRIEF DESCRIPTION OF THE DRAWINGS

Reference is now made to the following descriptions taken in conjunction with the accompanying drawings, in which.

DETAILED DESCRIPTION

Figure 1:
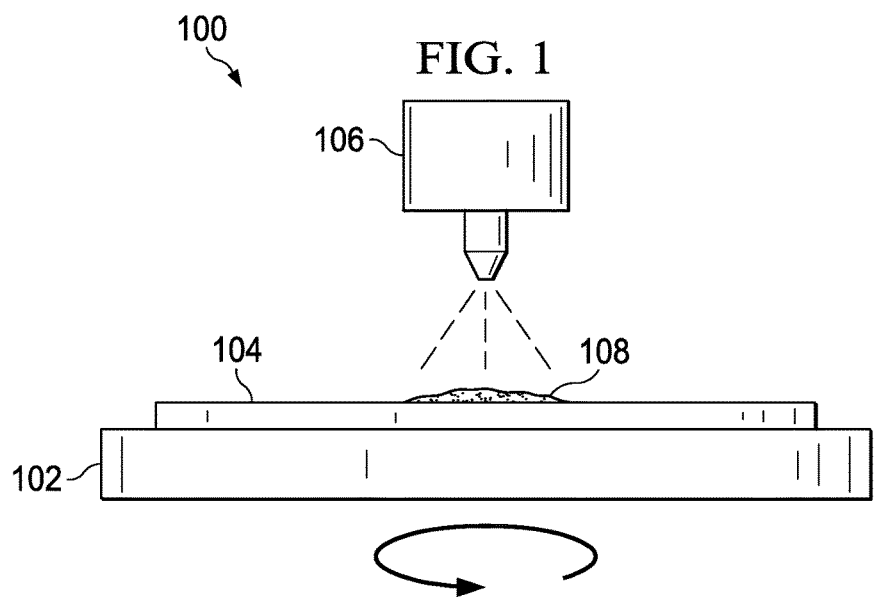
FIG. 1 is a schematic diagram of an exemplary photoresist coating set up according to some embodiments.

The making and using of various embodiments are discussed in detail below. It should be appreciated, however, that the present disclosure provides many applicable inventive concepts that can be embodied in a wide variety of specific contexts. The specific embodiments discussed are merely illustrative of specific ways to make and use, and do not limit the scope of the disclosure.

In addition, the present disclosure may repeat reference numerals and/or letters in the various examples. This repetition is for the purpose of simplicity and clarity and does not in itself dictate a relationship between the various embodiments and/or configurations discussed. Moreover, the formation of a feature on, connected to, and/or coupled to another feature in the present disclosure that follows may include embodiments in which the features are formed in direct contact, and may also include embodiments in which additional features may be formed interposing the features, such that the features may not be in direct contact. In addition, spatially relative terms, for example, "lower," "upper," "horizontal," "vertical," "above," "over," "below," "beneath," "up," "down," "top," "bottom," etc. as well as derivatives thereof (e.g., "horizontally," "downwardly," "upwardly," etc.) are used for ease of the present disclosure of one features relationship to another feature. The spatially relative terms are intended to cover different orientations of the device including the features.

FIG. 1 is a schematic diagram of an exemplary photoresist coating set up 100 according to some embodiments. A wafer 104 is placed on a wafer holder 102. The wafer holder 102 holds and rotates the wafer 104 at various speeds during the photoresist coating process. In some embodiments, the wafer holder 102 can be a chuck table. A dispenser 106 dispenses a photoresist 108 using a nozzle on the wafer 104 during the photoresist coating process in some embodiments. The size of the wafer holder 102 may depend on the size of the wafer 104, which can be 6", 8", 12", 18" or any other size wafer.

Figure 2:
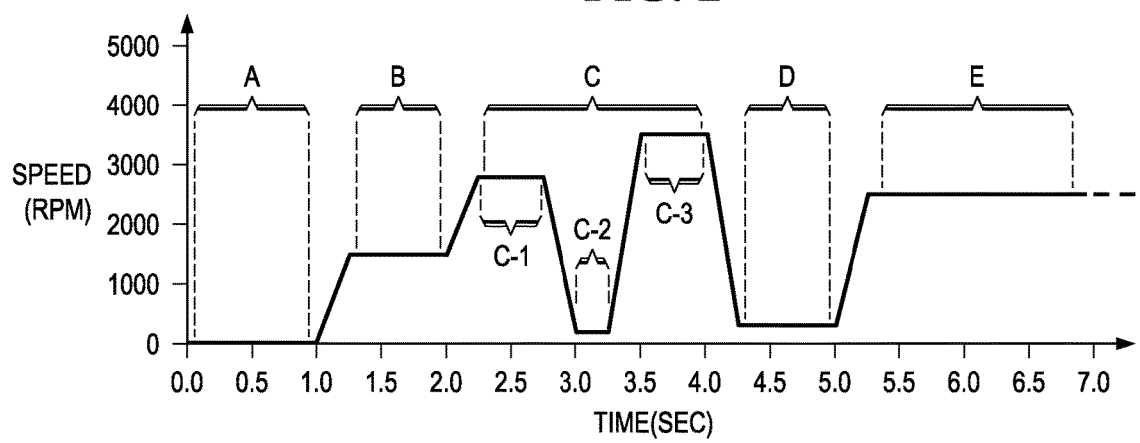
FIG. 2 is an exemplary photoresist coating time diagram according to some embodiments.

FIG. 2 is an exemplary photoresist coating time diagram according to some embodiments. There are five distinct stages A, B, C, D, and E shown along the time line. The Y-axis indicates the rotation speed of the wafer 104. During stage A, the wafer 104 is not rotated and a solvent is dispensed on the wafer 104. In some embodiments, the solvent comprises about 70% of 2-methoxy-1-methylethyl acetate (PGMA) and about 30% of propylene glycol methyl ether acetate (PGMEA).

At stage B, the wafer 104 is rotated to spread the solvent and wet the wafer 104 before the photoresist 108 is dispensed in the following stage. In some embodiments, the wafer 104 is rotated at 1,000 rpm-2,000 rpm.

Figure 3A:
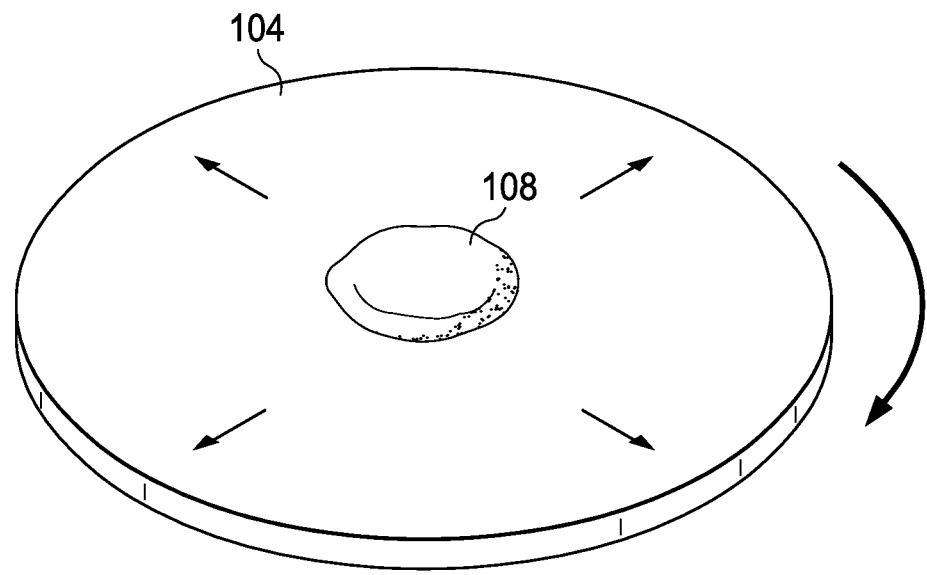
FIGS. 3A-3C are intermediate steps of an exemplary photoresist scheme according to some embodiments.

At stage C, there are 3 steps C-1, C-2, and C-3. The stage C is described in connection with FIGS. 3A-3C. At step C-1, the wafer 104 is rotated at a speed DS1 for time duration DT1 and the photoresist 108 is dispensed on the wafer 104. In some embodiments, DS1 is 1,000 rpm-3,000 rpm, and DT1 is 0.2 sec-0.6 sec. Due to the rotation speed of the wafer 104, the photoresist 108 is spread on the wafer 104 as shown in FIG. 3A.

Figure 3B:
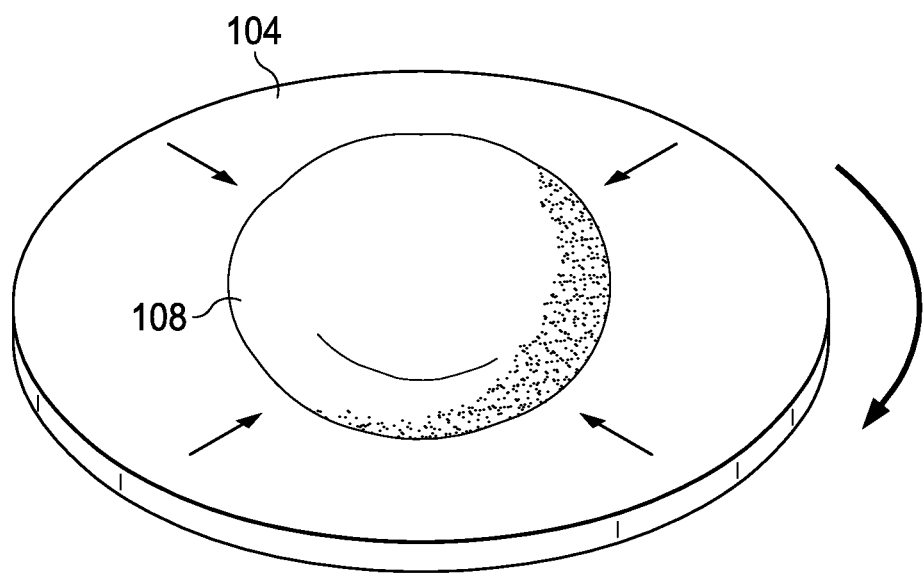

At step C-2, the wafer 104 is rotated at a speed DS2 for time duration DT2 and the photoresist 108 is dispensed on the wafer 104. In some embodiments, DS2 is 100 rpm-500 rpm, and DT2 is 0.1 sec-0.3 sec. Because the rotation speed of the wafer 104 is reduced during DT2 compared to that of DT1, the reaction force of some photoresist 108 from the change of the rotation speed is directed to the center of the wafer 104 as shown in FIG. 3B. The reaction force holds some moving photoresist 108 towards the center of the wafer 104 and keeps the photoresist 108 on the wafer 104 instead of continuously moving outward. This step is referred to as reflow.

Figure 3C:
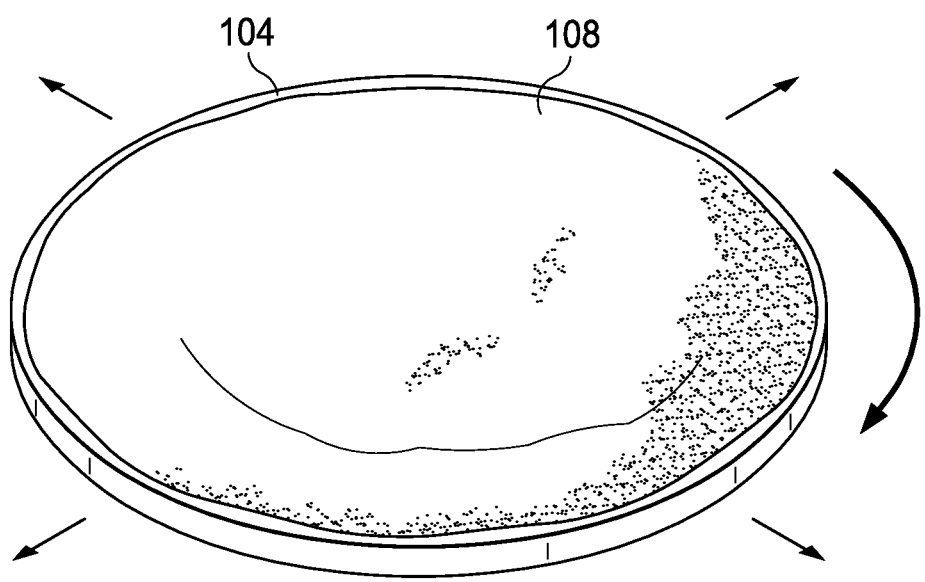

At step C-3, the wafer 104 is rotated at a speed DS3 for time duration DT3 and the photoresist 108 is dispensed on the wafer 104. In some embodiments, DS3 is 2,500 rpm-5,000 rpm, and DT3 is 0.6 sec-1.2 sec. Because the rotation speed of the wafer 104 is increased during DT3 compared to that of DT2, the photoresist 108 is spread on the wafer 104 again as shown in FIG. 3C. In some embodiments, the photoresist 108 covers the whole wafer 104 by the end of DT3 after steps C-1, C-2, and C-3.

The distance to the wafer 104 edge that the photoresist 108 has to move at step C-3 after step C-2 is reduced compared to the distance that the photoresist 108 has to move if starting from the center of the wafer 104. Also, the spin speed DS3 can be reduced compared to the speed if the photoresist 108 has to spin out to whole wafer 104 starting from the center of the wafer 104. The lower spin speed DS3 has a smaller gradient of tangent speed on the wafer 104 and a better thickness uniformity performance. Also, less photoresist 108 spins out of the wafer 104 to reduce the waste and increase the usage rate.

The relations among DS1, DS2, DS3, and a rotation speed DS of a conventional method during the photoresist 108 dispensing step are expressed by the following equation according to some embodiments.

$$DS > DS3 \geq DS1 \gg DS2 \qquad \text{Equation (1).}$$

The relations among DT1, DT2, DT3, and a time duration DT of a conventional method during the photoresist 108 dispensing step are expressed by the following equation according to some embodiments.

$$DT > DT3 > DT1 \geq DT2 \qquad \text{Equation (2).}$$

In this example, the photoresist 108 is dispensed during each time duration of DT1, DT2, and DT3. In some embodiments, the photoresist 108 is dispensed on the wafer 104 during DT1 and at least a portion of a time interval that includes DT2 and DT3. In some other embodiments, there can be more than two time periods such as DT1 and DT3 with high rotation speed at the stage C. For example, there can be three or more time periods with high rotation speed with intervening time periods such as DT2 with low rotation speeds in between.

At stage D, the wafer 104 is rotated at a speed lower than DS3. This is the second reflow to hold the photoresist 108 on the wafer 104, similar to step C-2 as described above. There is no photoresist 108 dispense during the stage D. The rotation speed of the wafer 104 during the stage D is 100 rpm-500 rpm and the time duration of the stage D is longer than the C-2 step in some embodiments. In the example shown in FIG. 2, the time duration of the stage D is about 0.75 sec.

At stage E, a higher rotation speed of the wafer 104 than the stage D is maintained for a longer time duration to control the average photoresist 108 thickness and achieve a more uniform distribution of the photoresist 108. In some embodiments, the stage E lasts about 20 sec-30 sec.

The photoresist coating scheme described above reduces the photoresist usage by 23.1%-46.8% compared to other methods. In one example, the photoresist usage was reduced from 0.8 ml using a conventional method to 0.45 ml using the method described above. Also the scheme also achieves better uniformity of the photoresist thickness over the wafer 104 with less coating defects by using the double reflow process (i.e., step C-2 and stage D). As a result of the double reflow process, more photoresist remains on the wafer and also uses less photoresist to cover the whole wafer.

According to some embodiments, a method includes rotating a wafer at a first speed for a first time duration. The wafer is rotated at a second speed that is lower than the first speed for a second time duration after the first time duration. The wafer is rotated at a third speed that is higher than the second speed for a third time duration after the second time duration. A photoresist is dispensed on the wafer during the first time duration and at least a portion of a time interval including the second time duration and the third time duration.

According to some embodiments, a method includes dispensing a solvent on a wafer. The wafer is rotated at a first speed for a first time duration. The wafer is rotated at a second speed that is lower than the first speed for a second time duration after the first time duration. The wafer is rotated at a third speed that is higher than the second speed for a third time duration after the second time duration. A photoresist is dispensed on the wafer during each of the first time duration, the second time duration, and the third time duration.

According to some embodiments, a method includes dispensing a solvent a wafer. The wafer is rotated at a first speed for a first time duration. The wafer is rotated at a second speed that is lower than the first speed for a second time duration after the first time duration. The wafer is rotated at a third speed that is higher than the second speed for a third time duration after the second time duration. A photoresist is dispensed on the wafer during each of the first time duration, the second time duration, and the third time duration. The wafer is rotated at a fourth speed that is lower than the third speed for a fourth time duration after the third time duration. The wafer is rotated at a fifth speed that is higher than the fourth speed for a fifth time duration after the fourth time duration.

A skilled person in the art will appreciate that there can be many embodiment variations of this disclosure. Although the embodiments and their features have been described in detail, it should be understood that various changes, substitutions and alterations can be made herein without departing from the spirit and scope of the embodiments. Moreover, the scope of the present application is not intended to be limited to the particular embodiments of the process, machine, manufacture, and composition of matter, means, methods and steps described in the specification. As one of ordinary skill in the art will readily appreciate from the disclosed embodiments, processes, machines, manufacture, compositions of matter, means, methods, or steps, presently existing or later to be developed, that perform substantially the same function or achieve substantially the same result as the corresponding embodiments described herein may be utilized according to the present disclosure.

The above method embodiment shows exemplary steps, but they are not necessarily required to be performed in the order shown. Steps may be added, replaced, changed order, and/or eliminated as appropriate, in accordance with the spirit and scope of embodiment of the disclosure. Embodiments that combine different claims and/or different embodiments are within the scope of the disclosure and will be apparent to those skilled in the art after reviewing this disclosure.

What is claimed is:

1. A method, comprising:
dispensing a solvent on a wafer;
rotating the wafer at a constant solvent dispersal speed after the dispensing the solvent and prior to dispensing photoresist;
rotating the wafer at a constant first speed for a first time duration, wherein accelerating the wafer from the constant solvent dispersal speed to the constant first speed is performed at a constant acceleration;
rotating the wafer at a second speed that is less than the constant first speed for a second time duration after the first time duration, wherein accelerating the wafer from the constant first speed to the second speed is performed at a constant acceleration;
rotating the wafer at a third speed for a third time duration after the second time duration, wherein the third time duration lasts as long as the wafer is rotating at the third speed, wherein the third speed is greater than the constant first speed by between 1500 rpm and 4000 rpm; and
dispensing photoresist on the wafer within the first time duration, the second time duration and throughout the third time duration.

2. The method of claim 1, wherein the solvent comprises 2-methoxy-1-methylethyl acetate (PGMA) and propylene glycol methyl ether acetate (PGMEA).

3. The method of claim 1, wherein the constant first speed is in a range from 1,000 rpm to 3,000 rpm.

4. The method of claim 1, wherein the second speed is in a range from 100 rpm to 500 rpm.

5. The method of claim 1, wherein the third speed is in a range from 2,500 rpm to 5,000 rpm.

6. The method of claim 1, wherein the photoresist spreads across an entirety of the wafer by an end of the third time duration.

7. The method of claim 1, further comprising rotating the wafer at a fourth speed that is less than the third speed for a fourth time duration after the third time duration.

8. The method of claim 7, further comprising rotating the wafer at a fifth speed that is greater than the fourth speed for a fifth time duration after the fourth time duration.

9. The method of claim 8, wherein the fifth time duration is in a range from 20 sec to 30 sec.

10. The method of claim 1, wherein at an end of the dispensing on the wafer less than or equal to 0.45 ml of photoresist has been dispensed.

11. A method, comprising:
dispensing a solvent on a wafer;
accelerating a rotation speed of the wafer at a first constant acceleration to a constant solvent dispersal speed;
rotating the wafer at the constant solvent dispersal speed for a solvent dispersal time prior to dispensing photoresist;
accelerating the rotation speed of the wafer at a second constant acceleration from the constant solvent dispersal speed to a first speed, wherein the accelerating the rotation speed of the wafer at the second constant acceleration starts at an end of the solvent dispersal time;
rotating the wafer at the first speed for a first time duration;
accelerating the rotation speed of the wafer at a third constant acceleration to a second speed after the first time duration, the accelerating the rotation speed of the wafer at the third constant acceleration starting at an end of the first time duration and slowing down the rotational speed of the wafer, wherein the second speed is less than the constant solvent dispersal speed;
rotating the wafer at the second speed that is less than the constant solvent dispersal speed for a second time duration after the first time duration;
rotating the wafer at a third speed that is greater than the first speed for a third time duration after the second time duration, the third time duration being greater than the first time duration by a first time period, wherein the first time period is part of the third time duration and is located at an end of the third time duration; and
dispensing photoresist on the wafer during each of the first time duration, the second time duration, and the third time duration, wherein at an end of the dispensing the photoresist less than or equal to 0.45 ml of photoresist has been dispensed.

12. The method of claim 11, wherein the first speed is in a range from 1,000 rpm to 3,000 rpm.

13. The method of claim 11, wherein the second speed is in a range from 100 rpm to 500 rpm.

14. The method of claim 13, wherein the third speed is in a range from 2,500 rpm to 5,000 rpm.

15. The method of claim 11, wherein the photoresist spreads across an entirety of the wafer by an end of the third time duration.

16. A method, comprising:
dispensing a solvent on a wafer;
rotating the wafer at a solvent dispersal speed after the dispensing the solvent and prior to a dispensing of photoresist, the rotating the wafer at the solvent dispersal speed being performed at a constant speed until a first point in time;
rotating the wafer at a first speed for a first time duration between a second point in time and a third point in time, wherein a rate of change of rotation of the wafer between the first point in time and the second point in time is constant;
starting at a fourth point in time, rotating the wafer at a second speed that is less than the first speed for a second time duration after the first time duration, wherein a rate of change of rotation of the wafer between the third point in time and the fourth point in time is constant;
rotating the wafer at a third speed that is greater than each of the first speed and the second speed for a third time duration after the second time duration, the third time duration being greater than the first time duration;
dispensing photoresist on the wafer during each of the first time duration, the second time duration, and until an end of the third time duration;
rotating the wafer at a fourth speed that is less than the third speed and greater than or equal to the second speed for a fourth time duration after the third time duration; and
rotating the wafer at a fifth speed that is greater than the fourth speed for a fifth time duration after the fourth time duration.

17. The method of claim 16, wherein the photoresist spreads across an entirety of the wafer by an end of the third time duration.

18. The method of claim 16, wherein at an end of the dispensing on the wafer less than or equal to 0.45 ml of photoresist has been dispensed.

19. A method comprising:
dispensing a solvent on a wafer while the wafer is stationary;
after dispensing the solvent, rotating the wafer at a first speed for a first duration, no photoresist being dispensed during the first duration;
after the first duration, rotating the wafer at a second speed for a second duration;
after the second duration, rotating the wafer at a third speed for a third duration, the second speed being greater than the third speed by between 500 rpm and 2900 rpm, the second duration being equal to or greater than the third duration;
after the third duration, rotating the wafer at a fourth speed for a fourth duration, the fourth speed being greater than the second speed, the fourth duration being greater than the second duration;
after the fourth duration, rotating the wafer at a fifth speed for a fifth duration, the fifth speed being less than the fourth speed;
after the fifth duration, rotating the wafer at a sixth speed for a sixth duration, the sixth speed being greater than the fifth speed;
dispensing photoresist onto the wafer during each of the second duration, the third duration, and the length of the fourth duration;
after the sixth duration, rotating the wafer at a seventh speed for a seventh duration, no photoresist being dispensed during the seventh duration, the seventh speed being less than the fourth speed; and
after the seventh duration, rotating the wafer at an eighth speed greater than the seventh speed.

20. The method of claim 19, wherein an acceleration between the first speed and the second speed is constant.

21. The method of claim 20, wherein at an end of the dispensing less than or equal to 0.45 ml of photoresist has been dispensed.

* * * * *